United States Patent [19]

Sugimoto

[11] 4,427,903

[45] Jan. 24, 1984

[54] VOLTAGE CURRENT CONVERTER CIRCUIT

[75] Inventor: Masunori Sugimoto, Tokyo, Japan

[73] Assignee: Nippon Electric Co., Ltd., Tokyo, Japan

[21] Appl. No.: 276,742

[22] Filed: Jun. 24, 1981

[30] Foreign Application Priority Data

Jun. 24, 1980 [JP] Japan ................................. 55-85367
May 14, 1981 [JP] Japan ................................. 56-72516

[51] Int. Cl.³ .......................... H03K 5/24; H03F 3/45
[52] U.S. Cl. .................................. 307/355; 307/497; 307/297; 330/253
[58] Field of Search .............. 307/350, 355, 260, 494, 307/497, 296 R, 297, 548, 550, 562, 568; 330/253, 261

[56] References Cited

U.S. PATENT DOCUMENTS

| | | | |
|---|---|---|---|
| 3,975,648 | 8/1976 | Tobey, Jr. et al. ................. | 307/296 |
| 4,050,030 | 9/1977 | Russell ........................... | 330/253 X |
| 4,301,421 | 11/1981 | Yokoyama ........................ | 330/253 |
| 4,341,963 | 7/1982 | Jenson et al. ..................... | 307/497 |
| 4,371,843 | 2/1983 | Fang et al. ....................... | 330/253 |

Primary Examiner—Larry N. Anagnos
Assistant Examiner—David R. Bertelson
Attorney, Agent, or Firm—Sughrue, Mion, Zinn, Macpeak and Seas

[57] ABSTRACT

A linear voltage-current converter circuit having a simplified circuit structure and operable over a wide voltage range is disclosed. The circuit comprises a first transistor having a drain connected to a power voltage through a first load element, a second and a third transistor having drains connected to the power voltage through a second load element, means for supplying gates of the first and second transistor with voltage signal, means responsive to a voltage difference at drains of the first and second transistors for controlling a gate voltage of the third transistor so as to reduce the voltage difference to zero, an output transistor, and means for supplying a gate of the output transistor with the same voltage as the gate voltage of the third transistor.

8 Claims, 14 Drawing Figures

VOLTAGE CURRENT CONVERTER CIRCUIT

BACKGROUND OF THE INVENTION

The present invention relates to a transistor circuit employing insulated gate field effect transistors, and more particularly to a voltage-current converter circuit.

Insulated gate field effect transistors (hereinafter abbreviated as IGFET's) have been widely used. Among their principal application, there exists a current source for supplying or absorbing a predetermined value of current. Such current sources are utilized, for example, as a constant current source for a differential amplifier or a current source for effecting charge or discharge of a time constant circuit. In accordance with improvements in circuit techniques in recent years, a capability of controlling a current value has been desired for a current source. In addition, due to the fact that power supply voltages have become low-voltage, stabilization of an operation at a low voltage and operations over a wide voltage range have been required.

As is well-known, a source-drain current of an IGFET would not vary linearly as a fuction of a gate-source voltage. More particularly, representing a gate-source voltage by $V_{GS}$, a drain-source current by $I_{DS}$, a threshold voltage by $V_T$ and a current amplification factor by $\beta$, when the drain-source voltage $V_{DS}$ fulfils the condition of $V_{DS} > V_{GS} - V_T$, the following relation is established:

$$I_{DS} = \beta(V_{GS} - V_T)^2 \qquad (1)$$

and therefore, the drain-source current $I_{DS}$ has a square (the second powered) characteristic with respect to the gate-source voltage $V_{GS}$. In various applications, this becomes great obstruction in the case where an IGFET is used in a linear circuit for which a linear relation beween a voltage and a current is required.

However, even with IGFET's having such a characteristic, it is possible to contrive to obtain a linear relation between a voltage and a current. Now it is assumed that two IGFET's having respective threshold voltages $V_{T1}$ and $V_{T2}$ and an identical current amplification factor $\beta$ are prepared and a common voltage $V_{GS}$ is applied between their gates and sources. Then, the respective drain-source currents $I_{DS1}$ and $I_{DS2}$ are represented by the following equations, similarly to Equation-(1) above:

$$I_{DS1} = \beta(V_{GS} = V_{T1})^2 \qquad (2)$$

$$I_{DS2} = \beta(V_{GS} - V_{T2})^2 \qquad (3)$$

At this moment, the respective drain-source voltages $V_{DS1}$ and $V_{DS2}$ *fulfil the relations of* $V_{GS1} > V_{GS} - V_{T1}$ and $V_{DS2} > V_{GS} - V_{T2}$. Considering now the difference between these currents flowing through the respective IGFET's, from Equations-(2) and -(3) above it can be seen that the following relation is established.

$$I_{DS1} - I_{DS2} = 2\beta V_{GS}(V_{T2} - V_{T1}) + V_{T1}^2 - V_{T2}^2 \qquad (4)$$

In other words, the difference current between the drain-source currents of the two IGFET's has a linear relationship to the common gate-source voltage $V_{GS}$. Accordingly, if provision is made such that when the same gate-source voltage is applied to two IGFET's having different threshold voltages and the same current amplification factor, the difference current between the drain-source currents of the respective IGFET's can be detected. Thus, even in a circuit constructed of IGFET's it is possible to realize a linear voltage-current characteristic.

Although a sum of currents flowing through two IGFET's, respectively, can be obtained simply by connecting the IGFET's in parallel, a simple method for obtaining a difference between two currents has not been known.

SUMMARY OF THE INVENTION

It is one object of the present invention to provide a current source circuit which can output a current having a controllable current value.

Another object of the present invention is to provide a linear voltage-current converter circuit.

Still another object of the present invention is to provide a current source circuit having a wide range of operation voltage.

Yet another object of the present invention is to provide a circuit in which a difference current between currents flowing through two IGFET's can be obtained in a relatively simple manner.

According to one feature of the present invention, there is provided a linear voltage-current converter circuit comprising a first load element having one end connected to a first voltage source; a first IGFET having a drain electrode connected to the other end of said first load element, a source electrode connected to a second voltage source and a gate electrode connected to a first input terminal; a second load element having one end connected to said first voltage source; a second IGFET having a drain electrode connected to the other end of said second load element, a source electrode connected to said second voltage source and a gate electrode connected to a second input terminal; a third IGFET having a drain electrode connected to the drain electrode of said second IGFET and a source electrode connected to the source electrode of said second IGFET; a fourth IGFET having a drain electrode connected to an output terminal, a gate electrode connected to the gate electrode of said third IGFET and a source electrode connected to said second voltage source, and a differential amplifier having an inverted input terminal connected to the junction between said first load element and the drain electrode of said first IGFET, an uninverted input terminal connected to the junction between said second load element and the drain electrode of said second IGFET and an output terminal connected to the gate electrode of said third IGFET and the gate electrode of said fourth IGFET; said first and second input terminals being supplied with input voltages such that when said third IGFET is removed, the current flowing through said first load element may become larger than the current flowing through said second load element.

According to another feature of the present invention, there is provided a differential amplifier comprising a first IGFET having a drain electrode connected to a first voltage source, a gate electrode connected to a control terminal and a source electrode connected to a first output terminal; a second IGFET having a drain electrode connected to said first voltage source, a gate electrode connected to said control terminal and a source electrode connected to a second output terminal; a third IGFET having a drain electrode connected to said first output terminal, a gate electrode connected to a first input terminal and a source electrode connected to a second voltage source; a fourth IGFET having a drain connected to said second output terminal, a gate electrode connected to a second input terminal and a source electrode connected to said second voltage source; and means for inversely amplifying a sum of a voltage variation on said first output terminal and a voltage variation on said second output terminal and applying the amplified signal to said control terminal.

In the linear voltage-current converter circuit according to the present invention, a current proportional to an input voltage can be obtained over a wide range of input voltage. By employing such a linear voltage-current converter circuit as a current source for charging or discharging a capacitor in a time constant circuitry of an oscillator, it is possible to realize a variable frequency oscillator.

The linear voltage-current converter circuit according to the present invention can be also utilized effectively in an analog-digital converter for converting an analog input voltage to an analog input current proportional to the input voltage, or on the contrary, in a digital-analog converter for converting an analog output voltage to an analog output current proportional to the output voltage.

BRIEF DESCRIPTION OF THE DRAWINGS

The above-mentioned and other features and objects of the present invention will become more apparent with reference to the following description of preferred embodiments of the invention taken in conjunction with the accompanying drawings, wherein.

DETAILED DESCRIPTION OF THE PREFERRED EMBODIMENTS

Now one preferred embodiment of the present invention will be described with reference to FIG. 1. While the description will be made, assuming that the IGFET's used in the preferred embodiment are N-channel type MOSFET's for convenience of explanation, the present invention should not be limited to such type of IGFET's, but the invention could be practiced basically in the same manner even with P-channel type MOSFET's.

Figure 1:
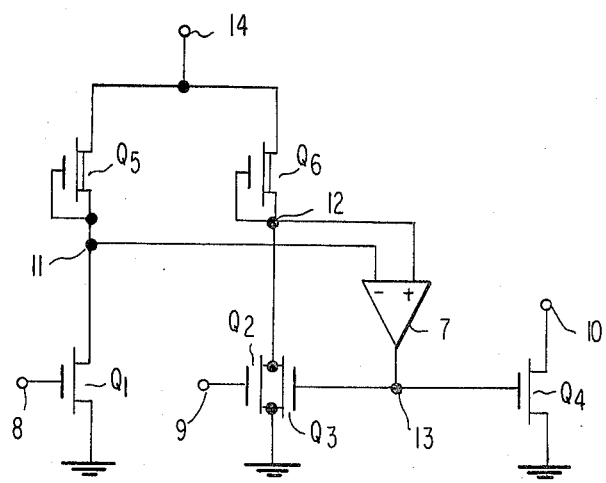
FIG. 1 is a circuit diagram showing one preferred embodiment of the present invention.

In the preferred embodiment shown in FIG. 1, while depletion type MOSFET's $Q_5$ and $Q_6$ having their respective gate electrode and source electrode connected together are used as first and second load elements, respectively, the present invention should not be limited to the use of such load elements. The voltage-current characteristics of the first load element $Q_5$ and the second load element $Q_6$ are selected to be identical. A first MOSFET $Q_1$ and a second MOSFET $Q_2$ have their gate electrodes connected to input terminals 8 and 9, respectively. The characteristics of the first MOSFET $Q_1$ and the second MOSFET $Q_2$ are selected such that under the condition where a third MOSFET $Q_3$ is removed, in the input voltage range for which this circuit must operate, the current flowing from a first voltage source 14 through the MOSFET's $Q_5$ and $Q_1$ to ground which forms a second voltage source may become larger than the current flowing from the first voltage source 14 through the MOSFET's $Q_6$ and $Q_2$ to ground. This means that under the above-mentioned condition the voltage $V_{11}$ at a point 11 is lower than the voltage $V_{12}$ at a point 12. A differential amplifier 7 should preferably have a gain of infinity in the ideal case, and it is connected in such polarity that when the voltage $V_{11}$ is lower than the voltage $V_{12}$, the voltage at a point 13 is made more positive. When the voltage $V_{11}$ at the point 11 is lower than voltage $V_{12}$ at the point 12, the voltage difference is amplified by the differential amplifier 7 to make the voltage at the point 13 more positive, resulting in increase of the drain-source current of the MOSFET $Q_3$, and thereby the voltage $V_{12}$ is lowered. On the contrary, when the voltage $V_{11}$ is higher than the voltage $V_{12}$, the voltage $V_{13}$ is lowered, so that the drain-source current of the MOSFET $Q_3$ decreases, and thereby the voltage $V_{12}$ is raised. In this way, the voltages $V_{11}$ and $V_{12}$ are equalized by negative feedback. Since the current-voltage characteristics of the load elements $Q_5$ and $Q_6$ are identical, under the condition where the voltages $V_{11}$ and $V_{12}$ are equal to each other, the values of the currents flowing through the respective load elements are equal to each other. Accordingly, if the currents flowing through the drain-source paths of the MOSFET's $Q_1$, $Q_2$ and $Q_3$ are represented by $I_1$, $I_2$ and $I_3$, respectively, the relation of:

$$I_1 = I_2 + I_3$$

is established, and consequently, the current $I_3$ becomes equal to the difference between the currents $I_1$ and $I_2$. Since the threshold values of the MOSFET $Q_3$ and a fourth MOSFET $Q_4$ are identical, so long as the voltages $V_{12}$, $V_{13}$ and $V_{10}$ at the points 12, 13 and 10, respectively, fulfil the relations of $V_{12} > V_{13} - V_T$ and $V_{10} > V_{13} - V_T$, where $V_T$ represents the threshold values of the MOSFET $Q_3$ and MOSFET $Q_4$, the current flowing through the drain-source path of the MOSFET $Q_3$ and the current flowing through the drain-source path of the MOSFET $Q_4$ are proportional to each other. In other words, in the illustrated circuit, an output current proportional to a difference between the drain-source current of the MOSFET $Q_1$ and the drain-source current of the MOSFET $Q_2$ can be derived from the output terminal 10. Furthermore, if the current amplification factors of the MOSFET's $Q_3$ and $Q_4$ are adjusted to be equal to each other, then it is also possible to obtain an output current equal to the difference current. Although the ground was used as the second voltage source in the above-described embodiment, the second voltage source should not be limited to such voltage source.

Now another preferred embodiment of the present invention will be described with reference to FIG. 2. In this embodiment, enhancement type MOSFET's $Q_5'$ and $Q_6'$ having their gates and drains connected in common to a voltage source $V_{DD}$ are used as load elements, and an input voltage $V_{in}$ is applied to input terminals 8 and 9 in common.

Figure 2:
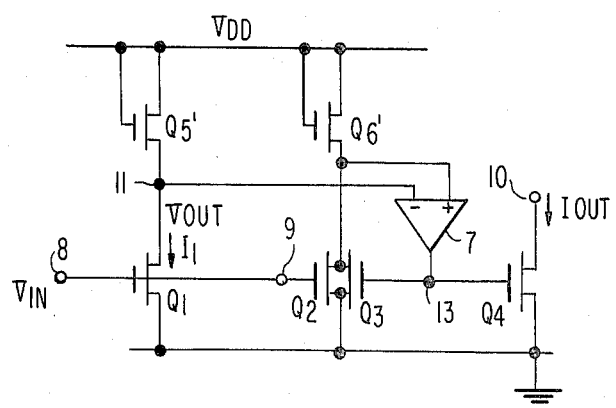
FIG. 2 is a circuit diagram showing another preferred embodiment of the present invention.

In FIG. 2, it is assumed that the voltage of the first voltage source ($V_{DD}$) is 10V and the second voltage source is the ground. It is also assumed that all the MOSFET's are of N-channel type, a threshold voltage $V_{T1}$ of a MOSFET $Q_1$ is 0.5 V and threshold voltages of MOSFET's $Q_2$, $Q_3$, $Q_4$, $Q_5'$ and $Q_6'$ are 1.0 V. Current amplification factors $\beta$ of the MOSFET's $Q_1$ and $Q_2$ are selected to be equal to each other. To this end, in the case where mobilities of electrons in the channels of the respective MOSFET's are equal to each other, it is only necessary to select channel width W and channel length L, respectively, to be equal to each other. However, in the case where the threshold voltages $V_T$ of the respective MOSFET's are made different by a known technique of ion implantation into the respective channel regions then the electron mobilities are also different between the respective MOSFET's, and hence, their respective W/L ratios are made different by the corresponding amount. The value of the ratio of mobilities is typically 70-100%, and by way of example, assuming that the electron mobility in the MOSFET $Q_1$ is equal to 90% of the electron mobility in the MOSFET $Q_2$, then it is only necessary to select the channel width W of the MOSFET $Q_2$ to be 0.9 times as small as the channel width W of the MOSFET $Q_1$. By way of example, the current amplification factors $\beta$ of the MOSFET's $Q_5'$ and $Q_6'$ are selected to be equal to ½ of that of the MOSFET $Q_2$. To that end, it is only necessary, for example, to design the channel widths W of the MOSFET's $Q_5'$ and $Q_6'$ to be 0.5 times as small as the channel width W of the MOSFET $Q_2$ and to design the channel length L of the MOSFET's $Q_5'$ and $Q_6'$ to that of be equal to that of the MOSFET $Q_2$. The current amplification factors $\beta$ of the MOSFET's $Q_3$ and $Q_4$ could be selected arbitrarily, and by way of example, they could be selected to both be equal to the current amplification factor $\beta$ of the MOSFET $Q_2$. To that end, it is only necessary to design the channel widths W and channel lengths L of the MOSFET's $Q_3$ and $Q_4$ to be equal to those of the MOSFET $Q_2$.

Figure 3:
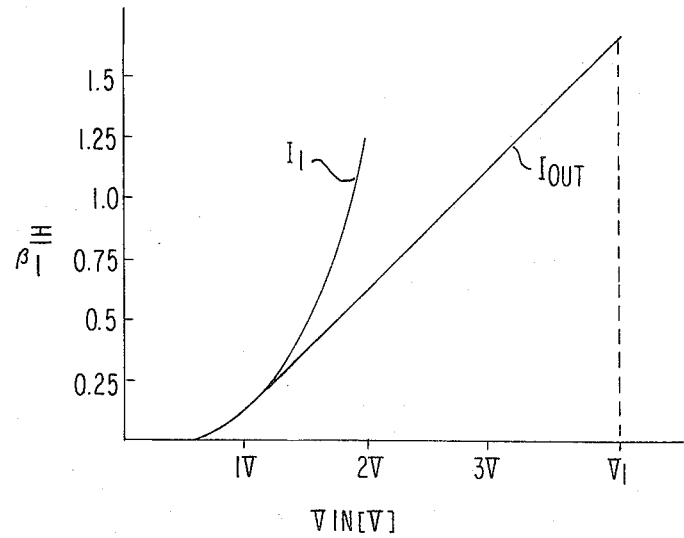
FIG. 3 is a diagram showing an input-output characteristic of the preferred embodiment shown in FIG. 2.

The relation between the input voltage $V_{in}$ and the output current $I_{out}$ in the above-described circuit arrangement is illustrated in FIG. 3. It is to be noted that the output current $I_{out}$ is represented as normalized with respect to the current amplification factor $\beta$, of the MOSFET $Q_1$. In FIG. 3 is also indicated a current I, flowing through the MOSFET $Q_1$. As seen from FIG. 3, while the current $I_1$ flowing through the MOSFET $Q_1$ has a large non-linearity, the current $I_{out}$ derived at the output is linear in the input voltage range of 1 V to $V_1$, which is equal to about 4 V.

In this circuit arrangement, the lower limit of the input voltage $V_{in}$ is the voltage which makes the MOSFET $Q_2$ cut off, that is, the threshold voltage $V_{T2}$, which is equal to 1.0 V in the assumed case. On the other hand, the upper limit of the input voltage $V_{in}$ is the input voltage $V_{in1}$ at the moment when the voltage $V_{11}$ at the point 11 becomes lower than $V_{in} - V_{T1}$ and hence the MOSFET $Q_1$ goes out of the saturated region, and accordingly, the threshold voltage $V_{T(Q5')}$ must satisfy the relation of $V_{in1} > V_{T(Q5')}$. This is always possible by increasing the current amplification factor $\beta$ of the MOSFET $Q_5'$ to a necessary extent. Therefore, under the ideal condition that the MOSFET's $Q_1$ and $Q_2$ have perfect square characteristics, the current amplification factors $\beta$ of the MOSFET's $Q_1$ and $Q_2$ are perfectly identical to each other and the gain A of the differential amplifier is infinite, a perfectly linear output current can be obtained with respect to an input voltage $V_{in}$ which falls in the range of $V_{T2} < V_{in} < V_{in1}$. In practice, however, such an ideal condition is impossible to be realized. Hence, a certain deviation from the perfectly linear relationship is necessary.

Among the above-described requirements, it is not so difficult in such an integrated circuit to make the characteristics of the MOSFET's $Q_5'$ and $Q_6'$ coincide with each other to a practically unobjectionable extent because the configurations of the MOSFET's $Q_5'$ and $Q_6'$ could be made identical. In addition, with respect to the deviation of the characteristics of the MOSFET's $Q_1$ and $Q_2$ from the square characteristics, also their characteristics can be approximated to the square characteristics to a practically unobjectionable extent by elongating the channel lengths to a certain extent. In view of the above-mentioned facts, the remaining two requirements serve as factors of principally limiting the linear characteristics. With regard to the current amplification factors $\beta$ of the MOSFET's $Q_1$ and $Q_2$, while they can be closely approximated by designing the configurations of the respective MOSFET's to be identical, in the case where more precise coincidence is desired to be realized, it can be realized by preliminarily seeking for a difference in electron mobilities due to a difference in the amount of ion implantation and determining configuration ratios while taking this difference into account. With regard to the requirement for the gain of the differential amplfier, representing the gain of the amplifier by A and the ratios of channel width/channel length of the MOSFET's $Q_3$ and $Q_6$ by $S_3$ and $S_6$, respectively, the following equation is fulfilled:

$$\frac{\text{Current Deviation}}{\text{Output Current}} = \frac{1}{1 + \frac{S_3}{S_6}A}$$

Since the relation of $(S_2/S_6) > 2$ is normally satisfied, it can be seen from the equation that a good linearity having a current deviation ratio of 1% is obtained with a gain A of about 50.

Figure 4:
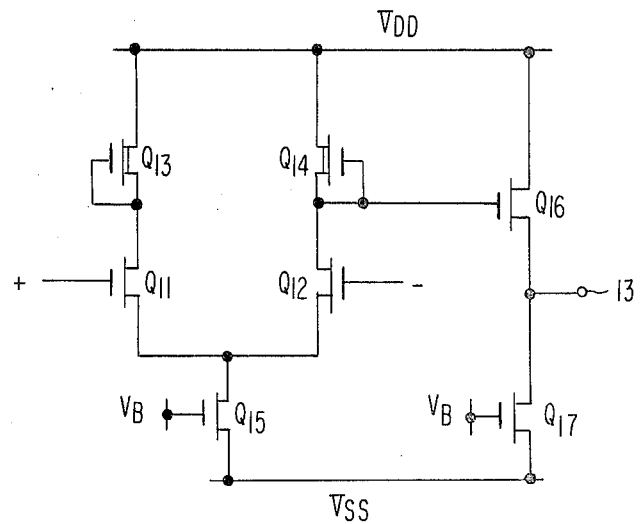
FIG. 4 is a circuit diagram showing one example of an amplifier employed in the preferred embodiment illustrated in FIG. 1 or 2.

A differential amplifier having a gain or a degree of amplification of about 50 can be realized by a simple circuit as illustrated in FIG. 4. In this figure, a gate electrode of a MOSFET $Q_{11}$ serves as an uninverted input terminal, while a gate electrode of MOSFET $Q_{12}$ serves as an inverted input terminal, and a point 13 serves as an output terminal. Only MOSFET's $Q_{13}$ and $Q_{14}$ are depletion type MOSFET's, and the other MOSFET's $Q_{11}$, $Q_{12}$, $Q_{15}$, $Q_{16}$ and $Q_{17}$ are enhancement type MOSFET's. The MOSFET's $Q_{15}$ and $Q_{17}$ are applied with a bias voltage $V_{13}$ at their gates to serve as current sources.

Now additional preferred embodiments of the present invention will be described with reference to FIGS. 5 and 6.

Figure 5:
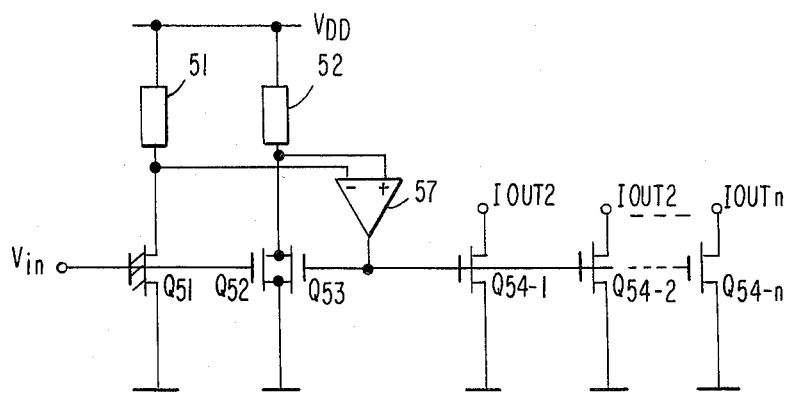
FIG. 5 is a circuit diagram showing still another preferred embodiment of the present invention.

In the preferred embodiment illustrated in FIG. 5, load elements 51 and 52 have constructions similar to the MOSFET's $Q_5$ and $Q_6$ in FIG. 1 or similar to the MOSFET's $Q_5'$ and $Q_6'$ in FIG. 2. MOSFET's $Q_{51}$, $Q_{52}$ and $Q_{53}$ have the functions equivalent to those of the MOSFET's $Q_1$, $Q_2$ and $Q_3$, respectively, in FIG. 1. In this preferred embodiment, there are provided MOSFET's $Q_{54-1}$, $Q_{54-2}$, ... $Q_{54-n}$ for deriving a plurality of output currents $I_{out\,1}$, $I_{out\,2}$, ... $I_{out\,n}$. In this instance, it is possible to differently preset the coefficients of variations of the respective output currents $I_{out\,1}$, $I_{out\,2}$, ..., $I_{out\,n}$ with respect to the input voltage by varying the ratio of channel width/channel length of the respective MOSFET's $Q_{54-1}$, $Q_{54-2}$, ..., $Q_{54-n}$. The circuit according to this preferred embodiment can be effectively utilized, for example, as a plurality of weighted current sources for feeding a D/A converter or an A/D converter, by respectively weighting the current values of the currents flowing through the MOSFET's $Q_{54-1}$, $Q_{54-2}$, ... $Q_{54-n}$, respectively.

Figure 6:
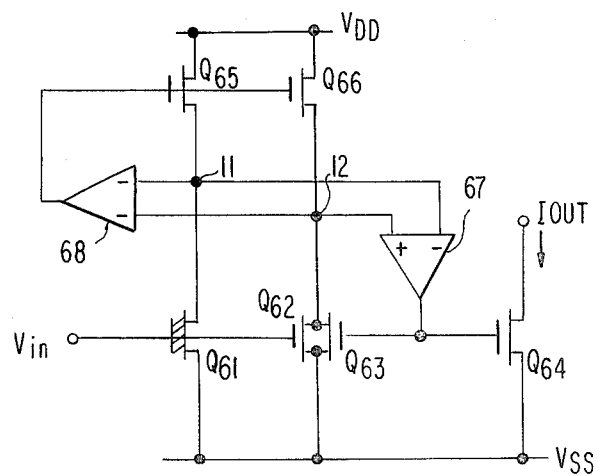
FIG. 6 is a circuit diagram showing yet another preferred embodiment of the present invention.

In the preferred embodiment illustrated in FIG. 6, control of gate voltages of enhancement type MOSFET's $Q_{65}$ and $Q_{66}$ serving as load elements is effected by means of an output of an amplifier 68 which generates an inverted output proportional to a sum of voltages at points 11 and 12. In other words, this preferred embodiment employs active loads as load elements, and in this embodiment a sum of voltages at drain electrodes of input MOSFET's $Q_{61}$ and $Q_{62}$ is negatively fed back to the gate electrodes of the MOSFET's $Q_{65}$ and $Q_{66}$ which serve as the active loads. In the embodiment lacking such negative feedback as shown in FIG. 1 or 2, as the input voltage approaches the voltage $V_{DD}$ of the first voltage source, the voltages at the drain electrodes of the input MOSFET's will change in the direction for approaching the voltage $V_{SS}$ of the second voltage source, and eventually the input MOSFET $Q_1$ goes out of the saturation region, so that it cannot achieve the desired operation. This phenomenon restricts the input voltage range of the circuit shown in FIG. 1 or 2. However, if negative feedback is effected as shown in FIG. 6, the voltage changes at the drain electrodes of the input MOSFET's $Q_{61}$ and $Q_{62}$ can be suppressed to small changes, and hence the input voltage range can be expanded.

Figure 7:
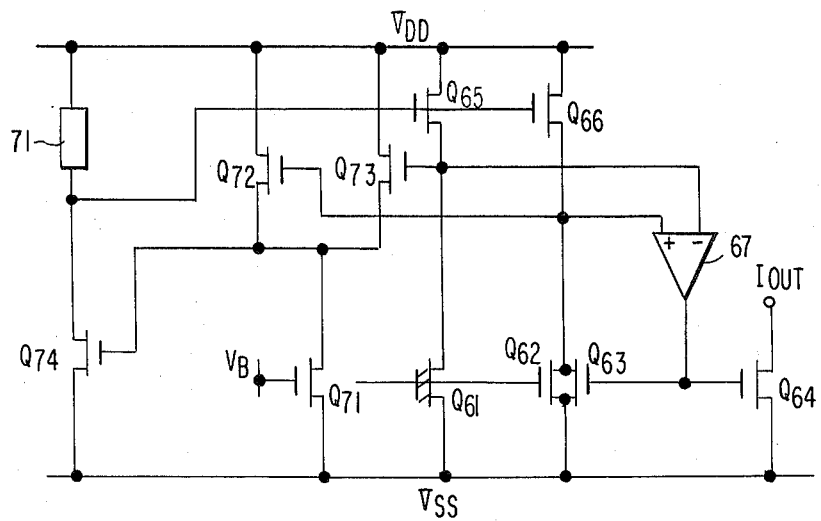
FIG. 7 is a circuit diagram illustrating one practical example of the preferred embodiment shown in FIG. 6.

One example of a practical circuit arrangement according to the above-described embodiment is illustrated in FIG. 7. In this circuit arrangement, MOSFET's $Q_{72}$ and $Q_{73}$ are transistors having the same configuration and the same threshold voltage, and a parallel combined output of these two MOSFET's controls an output of a ratio circuit consisting of a load element 71 and a MOSFET $Q_{74}$.

Figure 8:
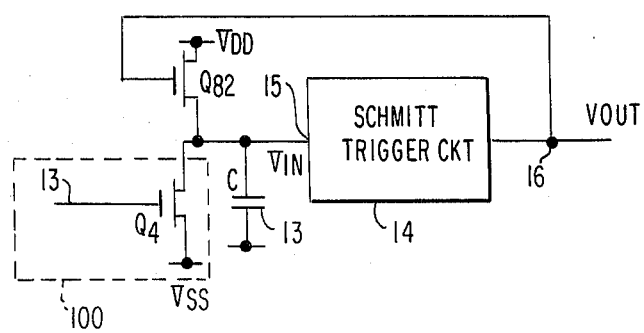
FIG. 8 is a circuit diagram showing a first example of an application of the present invention.
Figure 9:
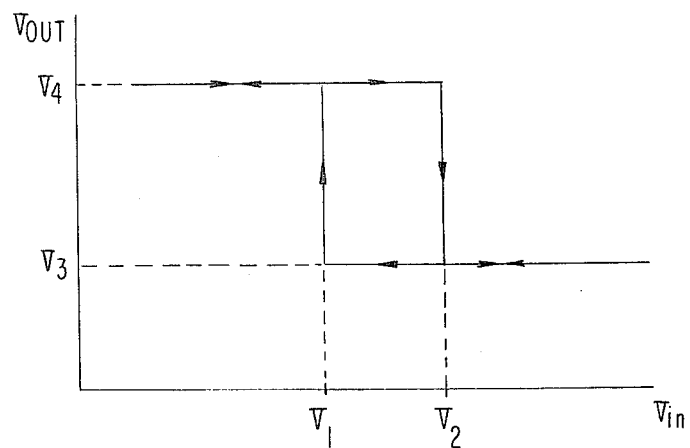
FIG. 9 is a diagram showing an input-output characteristic of a Schmitt trigger circuit in FIG. 8.

Now description will be made with regard to examples of application of the circuit according to the present invention. In an oscillator circuit, wherein an oscillation period is determined approximately in proportion to a time required for charging or discharging a capacitor up to a predetermined voltage by means of a current source, by employing the circuit according to the present invention as the current source for charging or discharging the capacitor, one can construct an oscillator circuit in which an oscillation frequency varies in a linear relationship with respect to an input voltage. Such an oscillator circuit is essentially necessary for forming a phase-locked loop (PLL). One example of a circuit arrangement of such an oscillator is illustrated in FIG. 8. In this figure, a MOSFET $Q_4$ is an output transistor of a circuit 100 according to the present invention, and a MOSFET $Q_{82}$ is a transistor having a sufficiently large current amplification factor as compared to that of the MOSFET $Q_4$. A Schmitt trigger circuit 14 has an input point 15 and an output point 16. A capacitor 13 has one end connected to the input point 15 and the other end connected to an arbitrary fixed voltage point. The input-output characteristic of the Schmitt trigger circuit 14 are illustrated in FIG. 9. It is to be noted that in this figure the change of the input voltage $V_{in}$ in the rightward direction along the abscissa and the change of the output voltage $V_{out}$ in the upward direction along the ordinate represent voltage changes in the same direction. Assuming now that the relations of $V_2>V_1$ and $V_4>V_3$ are satisfied for convenience of explanation, as the input voltage $V_{in}$ is successively increased starting from a voltage lower than the voltage $V_1$, at the moment when the input voltage $V_{in}$ has reached the voltage $V_2$, the output voltage $V_{out}$ changes from the voltage $V_4$ to the voltage $V_3$, whereas when the input voltage $V_{in}$ is successively decreased starting from a voltage higher than the voltage $V_2$, at the moment when it has reached the voltage $V_1$, the output voltage $V_{out}$ changes from the voltage $V_3$ to the voltage $V_4$.

In FIG. 8, it is assumed that under the condition where the output voltage $V_{out}$ is equal to $V_4$, the MOSFET $Q_{82}$ changes the capacitor 13 to bring the input voltage $V_{in}$ up to a fixed voltage $V_5$ that is higher than $V_2$ and thereby change the output voltage $V_{out}$ to $V_3$, whereas under the condition where the output voltage $V_{out}$ is equal to $V_3$, the MOSFET $Q_{82}$ is in a cut-off condition, while the MOSFET $Q_4$ in the circuit 100 of the present invention discharges the capacitor 13, so that the input voltage $V_{in}$ is gradually lowered and eventually it reaches $V_1$, when the output voltage $V_{out}$ is again raised to $V_4$. If the current amplification factor of the MOSFET $Q_{82}$ is so high that the time required for the MOSFET $Q_{82}$ to change the capacitor 13 and bring the input voltage $V_{in}$ to $V_5$ when the output voltage $V_{out}$ is $V_4$ is sufficiently shorter than the time required for the MOSFET $Q_4$ to discharge the capacitor 13 and bring the input voltage $V_{in}$ to $V_1$ when the output voltage $V_{out}$ is $V_3$, then the oscillation period of this oscillator circuit is approximately equal to the time required for the current generated at the drain electrode of the MOSFET $Q_4$ as an output current according to the present invention to discharge the capacitor 13 and change the voltage across the capacitor 13 from $V_5$ to $V_1$.

Figure 10:
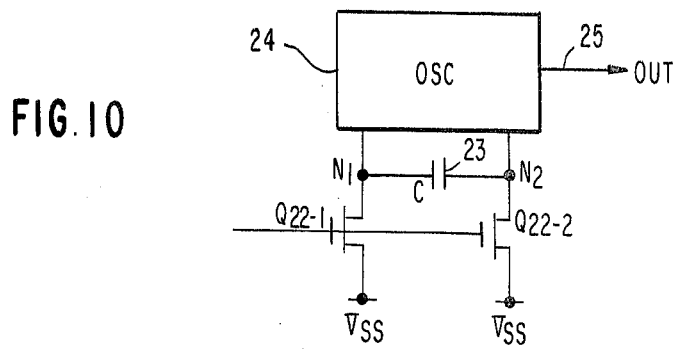
FIG. 10 is a circuit diagram showing a second example of application of the present invention.
Figure 11:
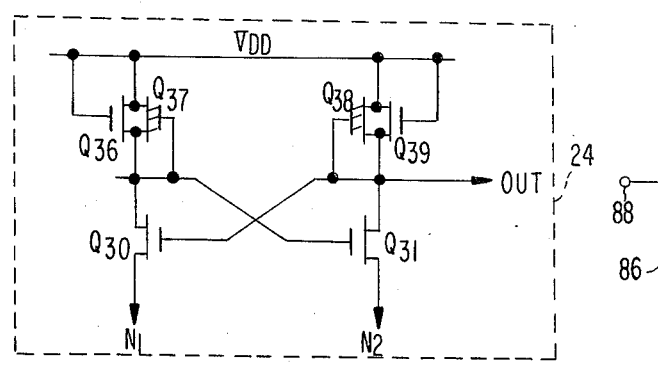
FIG. 11 is a circuit diagram illustrating one practical example of an oscillator circuit in FIG. 10.

Another example of similar oscillator circuits is illustrated in FIG. 10. In this figure, MOSFET's $Q_{22-1}$ and $Q_{22-2}$ are output transistors according to the present invention, and an oscillator circuit 24 is an oscillator circuit whose oscillation period is proportional to the time required for discharging a capacitor 23 by means of an external current source (in this instance, the MOSFET's $Q_{22-1}$ and $Q_{22-2}$). One example of such an oscillator circuit constructed by MOSFET's is illustrated in FIG. 11, in which MOSFET's $Q_{30}$, $Q_{31}$, $Q_{36}$ and $Q_{39}$ are enhancement type MOSFET's and MOSFET's $Q_{37}$ and $Q_{38}$ are depletion type MOSFET's.

As described above, according to the present invention a difference between currents flowing through two MOSFET's can be obtained through a relatively simple method, and so, the invention has a great effect in the case where it is desired to derive a difference current as in the case where a linear voltage-current characteristic is desired to realize in a MOSFET circuit.

Now more detailed description will be made on the circuit construction of the active load as used in the preferred embodiment illustrated in FIG. 6.

Heretofore, in a linear integrated circuit employing MOSFET's, a circuit having a common current source similar to that used in an integrated circuit of bipolar transistors has been used as a differential amplifier circuit. One typical example of such a known circuit in the prior art is illustrated in FIG. 12.

Figure 12:
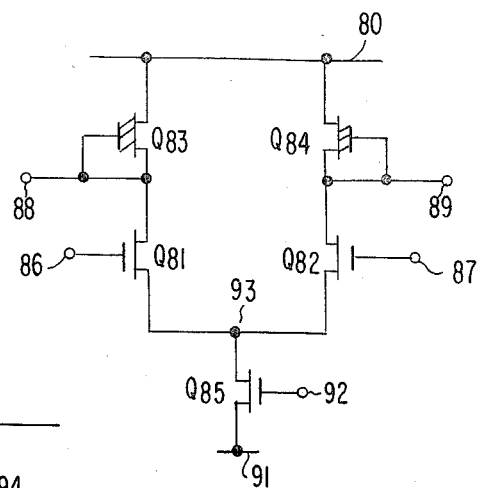
FIG. 12 is a circuit diagram showing a differential amplifier circuit in the prior art.

In FIG. 12, when voltage variations in the same directions are applied to input terminals 86 and 87, that is, upon applying the so-called in-phase input, a current flowing through a first branch including MOSFET's $Q_{81}$ and $Q_{83}$ and a current flowing through a second branch including MOSFET's $Q_{82}$ and $Q_{84}$ are equal to each other. Moreover, the sum of these currents is constant owing to the action of MOSFET $Q_{85}$, so that the currents flowing through the respective branches would not change, and accordingly voltages at output terminals 88 and 89 would not change. Whereas, when voltage variations in the opposite directions are applied to the input terminals 86 and 87, that is, upon applying the so-called differential input, the current flowing through the first branch including the MOSFET's $Q_{81}$ and $Q_{83}$ and the current flowing through the second branch including the MOSFET's $Q_{82}$ and $Q_{84}$ are subjected to variations in the opposite directions to each other, so that a difference would be produced between the respective currents, though the sum of the respective currents is held constant owing to the action of the MOSFET $Q_{85}$, and the difference is observed as a voltage difference between output terminals 88 and 89 by the actions of the load elements $Q_{83}$ and $Q_{84}$. As described above, the circuit shown in FIG. 12 would not produce any change in the output in response to an in-phase component of the input, but it would amplify only a differential component of the input.

As described above, in order for the heretofore known circuit shown in FIG. 12 to operate as a differential amplifier, it is necessary that a constant current flows through the drain-source path of the MOSFET $Q_{85}$, and in order that the constant current flows independently of the voltage at the junction 93, the MOSFET $Q_{85}$ must be held in a saturation region. To that end, representing the threshold voltage of the MOSFET $Q_{85}$ by $V_{T85}$, the bias voltage applied to the gate electrode of the MOSFET $Q_{85}$ by $V_B$ and the voltage at the junction 93 by $V_{93}$, it is only necessary to fulfil the following relation:

$$V_B - V_{T85} < V_{93}$$

Accordingly, representing the voltage of the second voltage source by $V_{SS}$, the voltage $V_{93}$ can be lowered to the proximity of the voltage $V_{SS}$ by selecting the bias voltage $V_B$ at a value that is only a little larger than $V_{SS} + V_{T85}$. However, as the bias voltage $V_B$ is lowered for the above-mentioned purpose, the current amplification factor of the MOSFET $Q_{85}$ must be increased by the corresponding amount, this means to increase the channel width of the MOSFET $Q_{85}$, and consequently, the geometrical dimensions of the MOSFET $Q_{85}$ are increased. Because of this increase of the geometrical dimensions, in practice, the bias voltage $V_B$ can be lowered only to the extent of about $V_{SS} + 2V_{T85}$, and accordingly, the voltage $V_{92}$ can be lowered only to the extent of about $V_{SS} + V_{T85}$. Since the voltages applied to the input terminals 86 and 87, respectively, must be higher than the voltage $V_{93}$ at least by the common threshold voltage $V_T$ of the MOSFET's $Q_{81}$ and $Q_{82}$, the lower limit of the allowable in-phase input voltages to the differential amplifier circuit shown in FIG. 12 is at most equal to the following value:

$$V_{SS} + V_{T85} + V_T$$

Since $V_{T85}$ is normally equal to the common threshold voltage $V_T$, the in-phase input voltages in this instance cannot be chosen lower than the value that is higher than the voltage $V_{SS}$ of the second voltage source by about twice the threshold voltage $V_T$.

However, recently in a MOSFET integrated circuit the demand for lowering the power supply voltage has been remarkable. Therefore, with the aforementioned fact that in the heretofore known circuit shown in FIG. 12 the lower limit of the in-phase input must take a value that is higher than the second power supply voltage $V_{SS}$ by about twice the threshold voltage of the enhancement type MOSFET, there is a big shortcoming that lowering of the power supply voltage is restricted in view of the necessity of obtaining a sufficiently large in-phase input region.

The concept of the previously discussed active load which has been proposed according to the present invention, can be expanded to a differential amplifier having a novel circuit arrangement which has a broader in-phase input voltage range than the known differential amplifiers in the prior art. One example of improved differential amplifiers according to the present invention will now be described.

Figure 13:
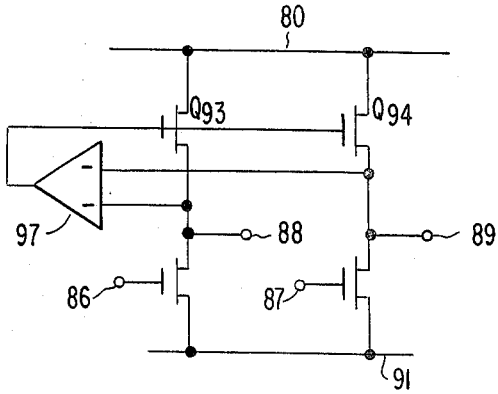
FIG. 13 is a circuit diagram showing a differential amplifier circuit according to the present invention.

In FIG. 13, MOSFET's $Q_{93}$ and $Q_{94}$ are MOSFET's prepared so as to have manually matched electric characteristics, the source electrode of the MOSFET $Q_{93}$ is connected to a first output terminal 88, and the source electrode of the MOSFET $Q_{94}$ is connected to a second output terminal 89. The respective drain electrodes are both connected to a first voltage source 80 having a voltage $V_{DD}$, and the respective gate electrodes are both connected to an output of an amplifier 97. MOSFET's 81 and 82 are also MOSFET's prepared so as to have mutually matched electric characteristics. The drain electrode of the MOSFET $Q_{81}$ is connected to the first output terminal 89, its gate electrode is connected to a first input terminal 86 and its source electrode is connected to a second voltage source 91. The drain electrode of the MOSFET $Q_{82}$ is connected to the second output terminal 89, its gate electrode is connected to a second input terminal 87 and its source electrode is connected to the second voltage source 91. The amplifier 97 inverts and amplifies the sum of the output voltage at the first output terminal 88 and the output voltage at the second output terminal 89, and applies the amplified voltage to the gates of the MOSFET's $Q_{93}$ to $Q_{94}$, respectively.

Now the operation of the preferred embodiment shown in FIG. 13 will be described. The voltage variations in the same direction generated at the output terminals 88 and 89 are inversely amplified by the amplifier 97, and the output of the amplifier 97 is applied to the gates of the MOSFET's $Q_{93}$ and $Q_{94}$. The voltage applied to the gate electrodes of the MOSFET's $Q_{93}$ and $Q_{94}$ in this way acts upon these MOSFET's in the direction for offsetting the voltage variations originally generated at the output terminals 88 and 89. Under the ideal condition that the absolute value of the gain of the amplifier 97 is infinite, the voltage variations in the same direction generated at the output terminals 88 and 89 are perfectly offset, and consequently, no voltage variation occurs at the output terminals 88 and 89. On the other hand, the voltage variations having the same magnitude and opposite directions generated at the output terminals 88 and 89 would not influence the output of the amplifier 97 because the sum of the voltage variations is zero, and hence the voltage variations would not be offset. Voltage variations in the same direction applied to the input terminals 86 and 87, that is, the so-called in-phase input voltages art to generate voltage variations in the same direction at the output terminals 88 and 89, and therefore, in this case the voltages at the output terminals 88 and 89 would not be altered by the action of the amplifier 97, as described above. On the other hand, voltage variations in the opposite directions applied to the input terminals 86 and 87, that is, the so-called differential input voltages act to generate voltage variations in the opposite directions at the output terminals 88 and 89, and hence these voltage variations would not be offset as described above. As discussed above, the illustrated circuit is provided with desired characteristics as a differential amplifier circuit which amplifies only a differential input without generating any variation at the outputs in response to an in-phase input.

Considering now the limit of the in-phase input voltages for sustaining the operation of the illustrated differential amplifier when the in-phase input voltages are made to approach the voltage of the second voltage source 91 in the preferred embodiment shown in FIG. 13, the differential amplifier is operable until the MOSFET $Q_{81}$ or $Q_{82}$ becomes cut off, and accordingly, the differential amplifier can operate until the in-phase input voltages reach the voltage that is higher in N-channel elements or lower in P-channel elements than the voltage of the second voltage source 91 by the threshold voltage of the MOSFET's $Q_{81}$ and $Q_{82}$. Recalling now the fact that in the heretofore known differential amplifier illustrated in FIG. 12 the in-phase input voltages were allowed to approach the voltage of the second voltage source 91 only as close as about twice the threshold voltage of the MOSFET's, the advantage obtained by the preferred embodiment of the present invention illustrated in FIG. 13 will be quite obvious.

In the circuit shown in FIG. 13, even if MOSFET's, resistor elements or other elements for adjusting a frequency response are disposed between the drain electrode of the MOSFET $Q_{93}$ and the first voltage source 80 and between the drain electrode of the MOSFET $Q_{94}$ and the first voltage source 80, or between the drain electrode of the MOSFET $Q_{81}$ and the output terminal 88 and between the drain electrode of the MOSFET $Q_{82}$ and the output terminal 89, and the respective locations are connected via these elements, so long as they are conductively communicated with respect to D.C. currents, these connections would not interfere with the effect of the present invention. However, it is not favorable to connect resistor elements or other elements between the source electrodes of the MOSFET's $Q_{81}$ and $Q_{82}$, respectively, and the second voltage source 91, because the allowable range of the in-phase input is narrowed by the amount equal to the voltages appearing across these connected elements. In addition, it must be carefully done to connect other elements between the source electrode of the MOSFET $Q_{93}$ and the output terminal 88 and between the source electrode of the MOSFET $Q_{94}$ and the output terminal 89, because sometimes the variations at the output of the amplifier 97 would be hardly reflected to the voltage variations at the output terminals, and in the case where the gain of the amplifier 97 is finite, the variations of the outputs in response to an in-phase input could not be sufficiently suppressed.

Figure 14:
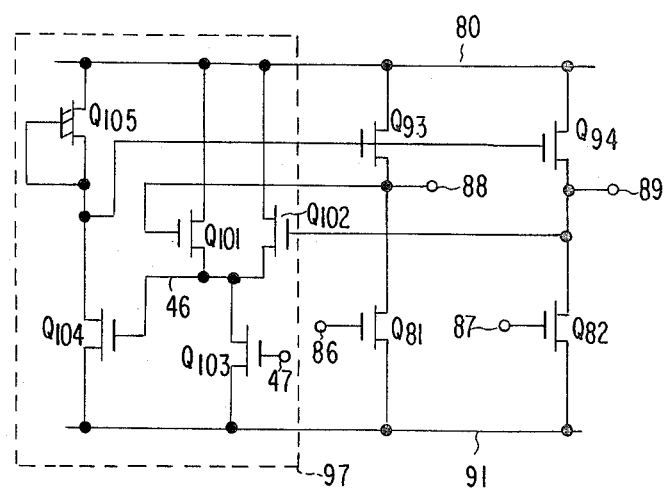
FIG. 14 is a circuit diagram illustrating one practical example of the differential amplifier circuit in FIG. 13.

FIG. 14 shows a more detailed circut arrangement of the embodiment illustrated in FIG. 13. The circuitry consisting of MOSFET's $Q_{101}$, $Q_{102}$, $Q_{103}$, $Q_{104}$ and $Q_{105}$ in FIG. 14 is one example of a practical circuit arrangement of the amplifier 97 in FIG. 13. The MOSFET's $Q_{101}$ and $Q_{102}$ are MOSFET's prepared so as to have mutually matched electric characteristics, their respective drain electrodes are both connected to the first voltage source 80, their respective source electrodes are both connected to a junction 46, and their gate electrodes are respectively connected to a first output terminal 88 and a second output terminal 89. The drain electrode of the MOSFET $Q_{103}$ is connected to the junction 46, its source electrode is connected to the second voltage source 91, and its gate electrode 47 is applied with a bias voltage. The gate electrode of the MOSFET $Q_{104}$ is connected to the junction 46, and the source electrode thereof is connected to the second voltage source 91. The MOSFET $Q_{105}$ is a load element, its drain electrode is connected to the first voltage source 80, and its source electrode and gate electrode are connected to the drain electrode of the MOSFET $Q_{104}$ and also connected to the gate electrodes of the MOSFET's $Q_{93}$ and $Q_{94}$. The circuitry consisting of the MOSFET's $Q_{101}$, $Q_{102}$ and $Q_{103}$ form a source-follower circuit which responds the sum of the voltage variations applied to the gate electrodes of the MOSFET's $Q_{101}$ and $Q_{102}$, respectively, to derive an output at the junction 46, and the above-referred sum of the voltage variations is transmitted to the subsequent stage as a voltage variation at the junction 46. The MOSFET's $Q_{104}$ and $Q_{105}$ form a so-called inverter, which inverts and amplifies the voltage variation at the junction 46 and applies the invertedly voltage change to the gate electrodes of the MOSFET's $Q_{93}$ and $Q_{94}$. Accordingly, the circuitry consisting of the MOSFET's $Q_{101}$, $Q_{102}$, $Q_{103}$, $Q_{104}$ and $Q_{105}$ can achieve the desired amplifier operation.

As described in detail above, according to the present invention there is provided a differential amplifier circuit which has a broader in-phase input voltage range that the differential amplifiers in the prior art, and especially, the present invention can provide a great advantage upon lowering the power supply voltage.

I claim:

1. A transistor circuit comprising a first voltage terminal, a second voltage terminal, a first series circuit including a first load element and a first field effect transistor connected in series between said first voltage terminal and said second voltage terminal, a second series circuit including a second load element and a parallel circuit of second and third field effect transistors connected in series between said first voltage terminal and said second voltage terminal, a fourth field effect transistor, means for connecting one of a source and a drain of said fourth transistor to said second voltage terminal, an amplifier having a first input terminal, a second input terminal and output terminal, said amplifier changing an output voltage at said output terminal in response to a voltage in said first input terminal with opposite phase relation and to a voltage in said second input terminal with in-phase relation, means for connecting an intermediary junction of said first series circuit to said first input terminal, means for connecting an intermediary junction of said second series circuit to said second input terminal, means for connecting said output terminal to gates of said third and fourth transistors and means for supplying gates of said first and second transistors with an input voltage, a current output terminal, and means for connecting said current output terminal to the other of said source and drain of said fourth transistor.

2. The circuit according to claim 1, in which a threshold voltage of said first transistor is different from that of said second transistor.

3. The circuit according to claim 1, in which a current amplification factor of said first transistor is larger than that of said second transistor.

4. The circuit according to claim 1, in which said first and second load element includes fifth and sixth field effect transistors.

5. The circuit according to claim 4, further comprising an inverting amplifier for producing an inverted signal of the sum of the voltages at said intermediary junctions of said first and second series cicruits, and means for supplying said gates of said fifth and sixth transistors with said inverted signal.

6. A transistor circuit comprising a first voltage terminal, a second voltage terminal, a first series circuit including first and second field effect transistors connected in series and between said first and second voltage terminals, a second series circuit including third and fourth field effect transistors connected in series and between said first and second voltage terminals, an inverting amplifier producing an inverted signal of the sum of voltages of intermediary junctions of said first and second series circuits, means for supplying gates of said first and third transistors with said inverted signal, means for supplying gates of said second and fourth transistors with an input signal in a differential manner, a first output terminal, a second output terminal, means for connecting said first output terminal to the intermediary junction of said first series circuit, and means for connecting said second output terminal to the intermediary junction of said second series circuit.

7. A linear voltage-current converter comprising a first load element, a second load element having the same current capacity as said first load element, a first field effect transistor connected so as to form a first series circuit with said first load element, second and third field effect transistors connected in parallel and forming a second series circuit with said second load element, first and second voltage terminals, means for connecting said first series circuit between said first and second voltage terminals, means for connecting said second series circuit between said first and second voltage terminals, a current amplification factor of said second transistor being smaller than that of said first field effect transistor, means for supplying gates of said first and second transistors with input voltage, means responsive to a voltage difference between intermediary junctions of said first series circuit and second series circuit for controlling a voltage at the gate of said third transistor so as to reduce said voltage difference to zero, a fourth field effect transistor, a current output terminal connected to one of a drain and a source of said fourth transistor, and means for supplying a gate of said fourth transistor with the same voltage as that at the gate of said third transistor, whereby a current having an amount in proportion to the amount of said input voltage is derived from said current output terminal.

8. A transistor circuit comprising first, second and third field effect transistors, each of said transistors having a source-drain current path and a gate for controlling the amount of current of said source-drain current path thereof, first and second voltage terminals, means for connecting the source-drain current path of said first transistor between said first and second voltage terminals, means for connecting the source-drain current paths of said second and third transistors in parallel between said first and second voltage terminals, means for supplying the gate of said first transistor with a control signal for controlling the amount of current flowing through the source-drain current path thereof, means for supplying the gate of said second transistor with a control signal for controlling the amount of current flowing through the source-drain current path thereof, first means for detecting value of current flowing through the source-drain current path of said first transistor, second means for detecting value of current flowing through the source-drain current path of said second transistor, and means responsive to outputs of said first means and said second means for controlling current flowing through the source-drain current path of said third transistor so as to make the sum of current values flowing through said second and third transistors close to the current value flowing through said first transistor.

* * * * *

UNITED STATES PATENT AND TRADEMARK OFFICE
CERTIFICATE OF CORRECTION

PATENT NO. : 4,427,903

DATED : January 24, 1984

INVENTOR(S) : MASUNORI SUGIMOTO

It is certified that error appears in the above-identified patent and that said Letters Patent is hereby corrected as shown below:

```
Column 1, line 28, "fulfils" should be --fulfills--;
          line 36, after "becomes", insert --a--;
          line 54, "fulfil" should be --fulfill--.
Column 3, line 41, change the "." after "2" to --,--;
          line 53, insert --an-- before "application";
          line 55, delete "." after "10" and insert --,--.
Column 4, line 58, "fulfil" should be --fulfill--.
Column 5, line 30, insert a --,-- after "regions".
Column 6, line 43, "amplfier" should be --amplifier--.
Column 8, line 10, delete the second "end";
          line 58, "whese" should be --whose--;
Column 9, line 51, "fulfil" should be --fulfill--.
Column 10, line 37, "manually" should be --mutually--.
Column 12, line 44, insert --amplified-- after "invertedly".

Column 13, line 26, "cicruits" should be --circuits--;
           line 37, "of" (second occurrence) should be --at--.
```

Signed and Sealed this

Twenty-ninth Day of May 1984

[SEAL]

Attest:

GERALD J. MOSSINGHOFF

Attesting Officer

Commissioner of Patents and Trademarks